(12) United States Patent
 Nagata

(10) Patent No.: US 10,705,150 B2
(45) Date of Patent: Jul. 7, 2020

(54) REMAINING BATTERY CHARGE MEASURING CIRCUIT, ELECTRONIC DEVICE, AND REMAINING BATTERY CHARGE MEASURING METHOD

(71) Applicant: FUJITSU LIMITED, Kawasaki-shi, Kanagawa (JP)

(72) Inventor: Jun-ichi Nagata, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 258 days.

(21) Appl. No.: 15/886,935

(22) Filed: Feb. 2, 2018

(65) Prior Publication Data

US 2018/0224507 A1   Aug. 9, 2018

(30) Foreign Application Priority Data

Feb. 6, 2017   (JP) .................. 2017-019485

(51) Int. Cl.
| | |
|---|---|
| *G01R 31/3842* | (2019.01) |
| *G01R 31/392* | (2019.01) |
| *G01R 31/385* | (2019.01) |
| *G01R 31/388* | (2019.01) |
| *H02J 7/00* | (2006.01) |

(52) U.S. Cl.
CPC ....... *G01R 31/3842* (2019.01); *G01R 31/386* (2019.01); *G01R 31/392* (2019.01); *H02J 7/0031* (2013.01); *H02J 7/0047* (2013.01); *G01R 31/388* (2019.01); *H02J 7/0048* (2020.01)

(58) Field of Classification Search
None
See application file for complete search history.

(56) References Cited

U.S. PATENT DOCUMENTS

| | | | |
|---|---|---|---|
| 2013/0046495 A1* | 2/2013 | Sim ...................... | H01M 10/48 702/63 |
| 2017/0244257 A1* | 8/2017 | Sung ..................... | H02J 7/0016 |

FOREIGN PATENT DOCUMENTS

| | | |
|---|---|---|
| JP | 6-289108 | 10/1994 |
| JP | 2004-191233 | 7/2004 |
| JP | 2009-128274 | 6/2009 |

* cited by examiner

*Primary Examiner* — John C Kuan
(74) *Attorney, Agent, or Firm* — Fujitsu Patent Center

(57) ABSTRACT

A remaining battery charge measuring circuit for measuring remaining charge of a battery, includes: an LC circuit including an inductance element and a capacitance element; and a switch element that controls coupling between the battery and the LC circuit, wherein the switch element disconnects the LC circuit from the battery, based on a resonant frequency by the LC circuit.

12 Claims, 16 Drawing Sheets

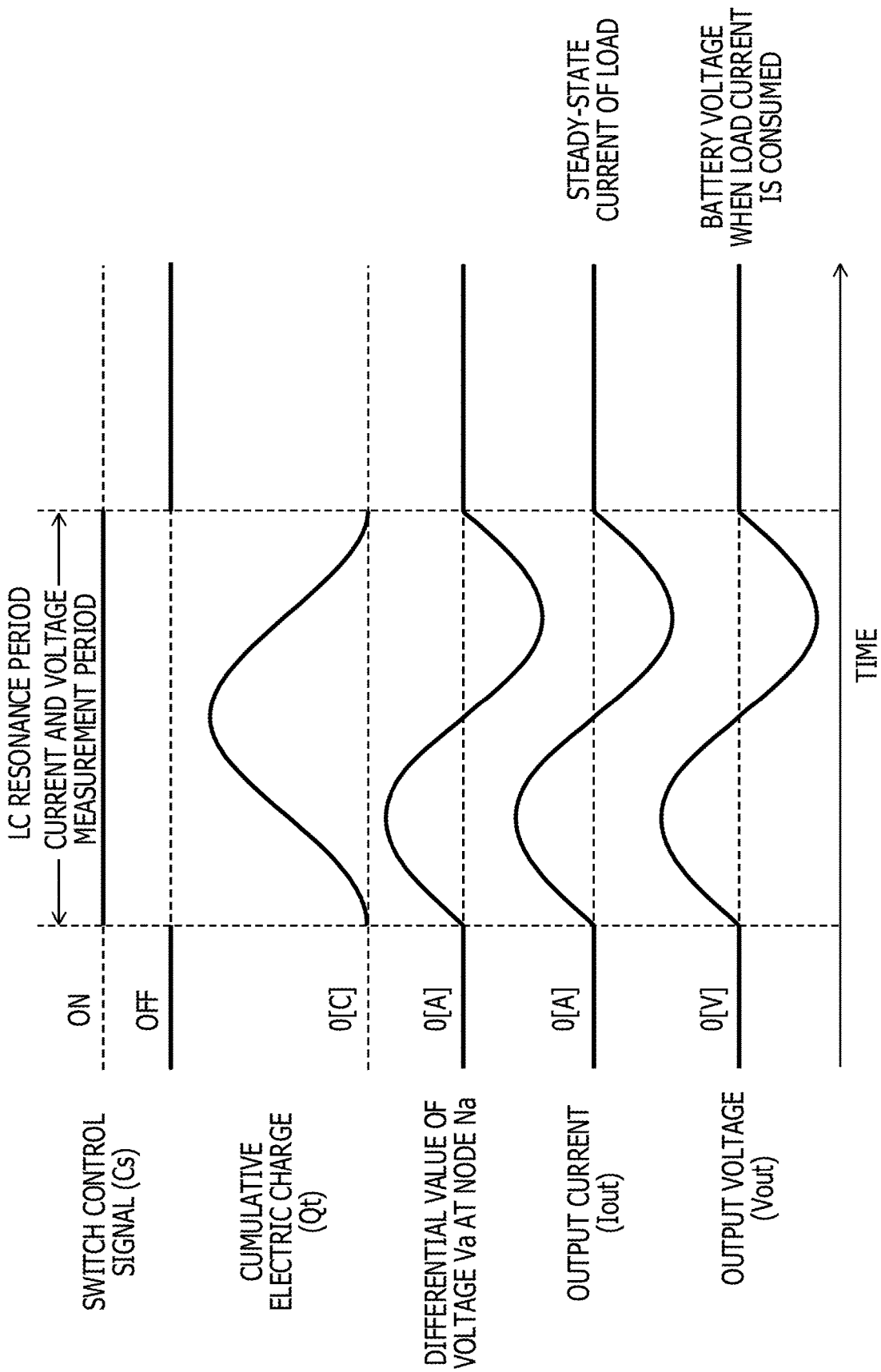

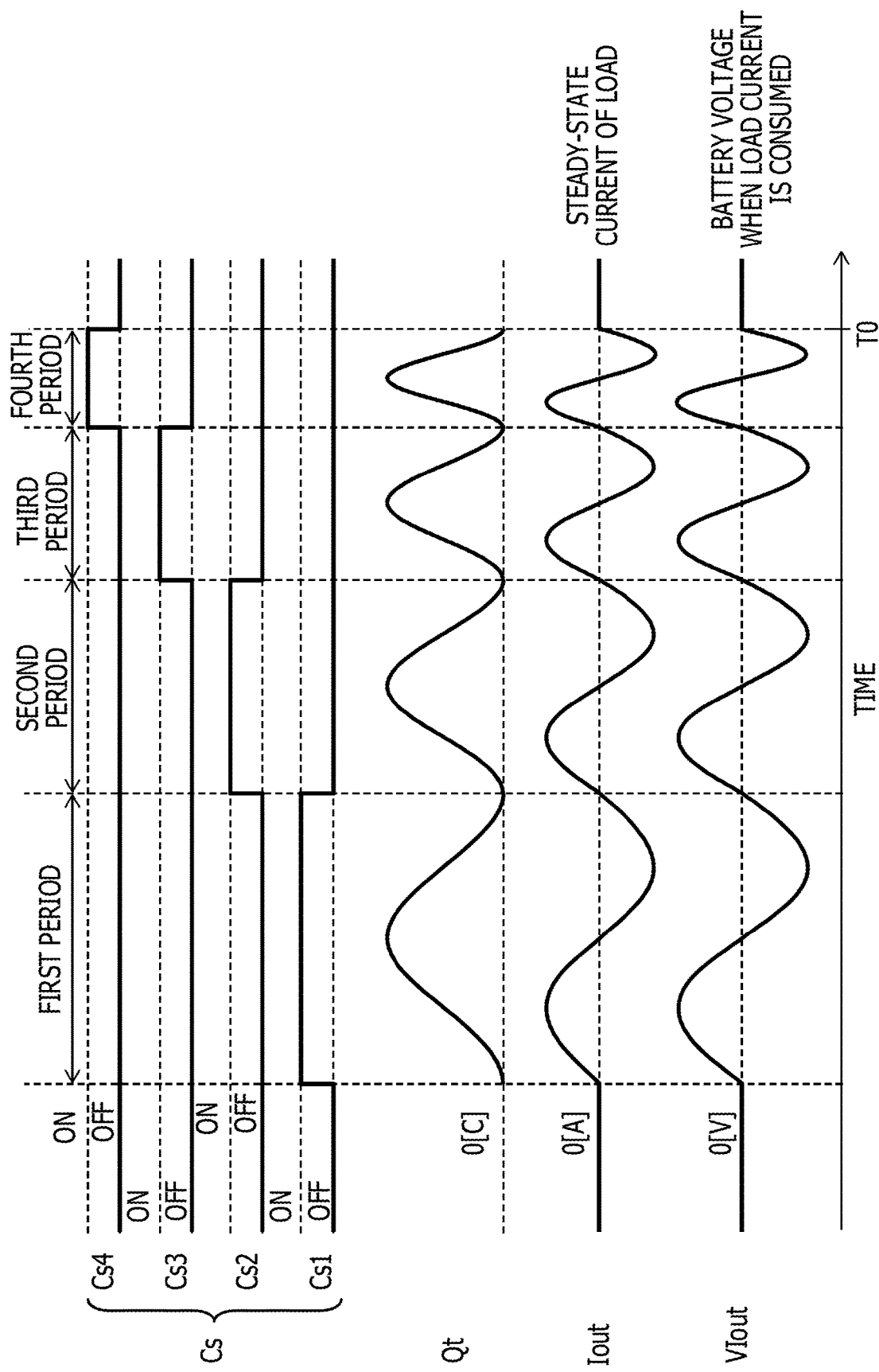

REMAINING BATTERY CHARGE MEASURING CIRCUIT, ELECTRONIC DEVICE, AND REMAINING BATTERY CHARGE MEASURING METHOD

CROSS-REFERENCE TO RELATED APPLICATION

This application is based upon and claims the benefit of priority of the prior Japanese Patent Application No. 2017-019485, filed on Feb. 6, 2017, the entire contents of which are incorporated herein by reference.

FIELD

The embodiments discussed herein are related to a remaining battery charge measuring circuit, an electronic device, and a remaining battery charge measuring method.

BACKGROUND

Battery-driven electronic devices, such as smartphones and tablet terminals, are widely used.

The related art is disclosed in Japanese Laid-open Patent Publication No. 2009-128274, 06-289108, or 2004-191233.

SUMMARY

According to an aspect of the embodiments, a remaining battery charge measuring circuit for measuring remaining charge of a battery, includes: an LC circuit including an inductance element and a capacitance element; and a switch element that controls coupling between the battery and the LC circuit, wherein the switch element disconnects the LC circuit from the battery, based on a resonant frequency by the LC circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 11 illustrates examples of operation waveforms obtained by a remaining battery charge measuring circuit as a result of executing the remaining battery charge measurement processing illustrated in FIG. 9;

FIG. 15 illustrates examples of operation waveforms of the remaining battery charge measuring circuits illustrated in FIGS. 14A and 14B.

DESCRIPTION OF EMBODIMENTS

A battery-driven electronic device measures the remaining battery charge (energy capacity remaining in the battery), and performs various control operations, such as switching of the power mode and the system function and informing a user of the remaining available time.

In such an electronic device, the impedance track technology, for example, is used for measuring (estimating) the remaining battery charge. In the impedance track technology, the internal impedance of a battery is measured to estimate the open-circuit voltage. More specifically, in the impedance track technology, the internal impedance of a battery is measured, so that the open-circuit voltage may indirectly be estimated. With this method, the remaining battery charge is stably measured without being influenced by the installation environments of a battery (electronic device), differences among individual batteries, and degradation of a battery.

To measure the remaining battery charge, this impedance track technology, for example, is used. In this method, when the internal impedance of a battery is measured, it is necessary to change the output current of the battery. This additional measurement current increases power consumption.

For example, an additional current, which does not contribute to supplying power to a load, is used, thereby increasing power consumption. The increased power consumption may be disadvantageous to electronic devices, such as smartphones, which are expected to be operable for an even longer time, or electronic devices driven by small-capacity batteries. A remaining battery charge measuring circuit according to an embodiment may be applicable to various battery-driven electronic devices, as well as to electronic devices which are expected to be operable for an even longer time and electronic devices driven by small-capacity batteries.

Figure 1:
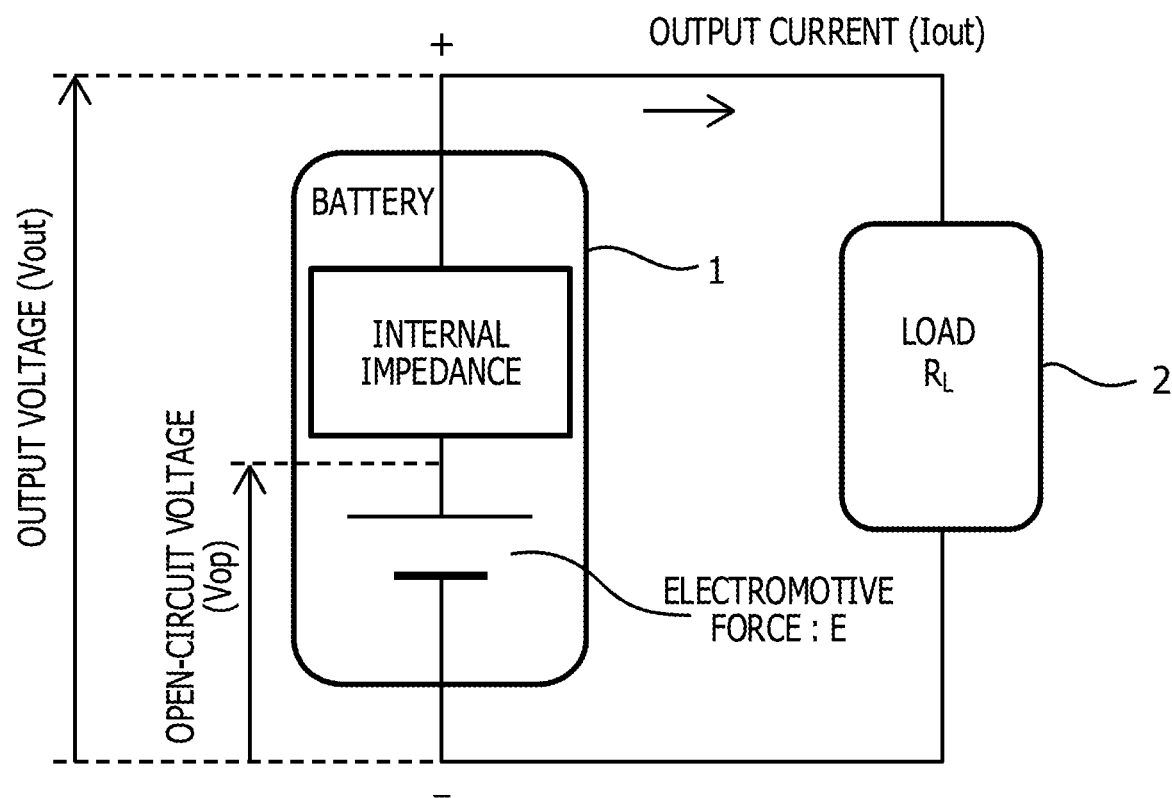
FIG. 1 illustrates an example of a remaining battery charge measuring circuit.

FIG. 1 illustrates an example of a remaining battery charge measuring circuit. By using the impedance track technology, the internal impedance of a battery is measured to estimate the open-circuit voltage of the battery.

In FIG. 1, a battery 1 and a load ($R_L$) 2 are illustrated. In FIG. 1, Vout is the output voltage, Vop is the open-circuit voltage, Iout is the output current, E is the electromotive force, and ri is the internal impedance of the battery 1. The load 2 is connected to both terminals (positive (+) and negative (−) electrodes) of the battery 1. The open-circuit voltage (voltage by the electromotive force E: remaining battery charge information) Vop may be difficult to directly measure while the load 2 is being operated.

Based on the equation: open-circuit voltage Vop=Vout−ri×Iout, for example, by using the impedance track technology, the internal impedance (resistance) ri of the battery 1 is measured, so that the open-circuit voltage Vop may indirectly be estimated. The impedance track technology enables stable estimations of the remaining battery charge (open-circuit voltage) without being influenced by the installation environments of an electronic device using the battery 1, the difference of the battery 1 from other batteries, and degradation of the battery 1.

Figure 2:
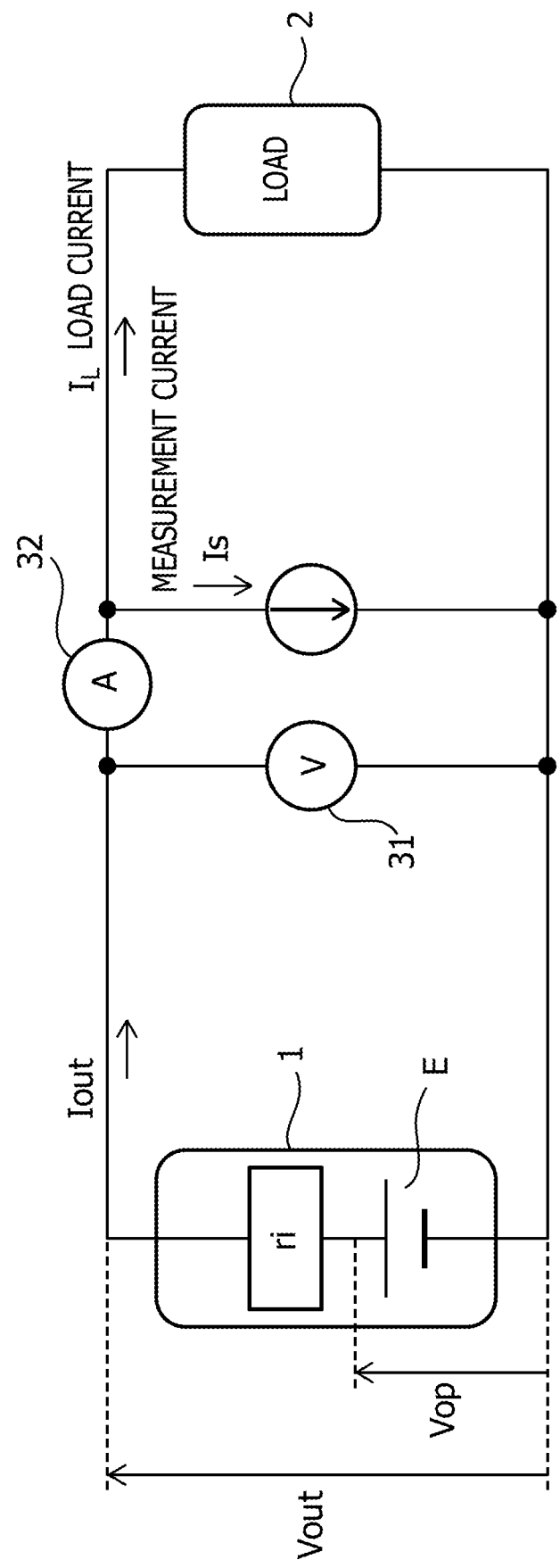
FIG. 2 illustrates an example of the remaining battery charge measuring circuit illustrated in FIG. 1.

FIG. 2 illustrates an example of the remaining battery charge measuring circuit illustrated in FIG. 1. In FIG. 2, a voltmeter (V: voltage measurer) 31 and an ammeter (A: current measurer) 32 are illustrated. In FIG. 2, $I_L$ is a load current and Is is a measurement current.

When the internal impedance ri of the battery 1 is measured by using the impedance track technology, it is need to change the output current Iout of the battery 1. The resulting additional measurement current Is increases power consumption. Concerning the output voltage Vout, for example, Vout=Vop 30 ri×Iout=Vop+ri×($I_L$+Is) is established. The output voltage Vout is measurable by the voltmeter 31, and the output current Iout is measurable by the ammeter 32. Vop and ri are unknown, and $I_L$ is fixed. Is is an additional current, which does not contribute to supplying power to the load 2, thereby causing a waste of power consumption.

An increase in the waste of power consumption by the additionally measurement current Is is becoming disadvantageous to electronic devices, such as smartphones, which are expected to be operable for an even longer time, and electronic devices driven by small-capacity batteries. As stated above, the remaining battery charge measuring circuit according to this embodiment may be applicable to various battery-driven electronic devices, as well as to electronic devices which are expected to be operable for an even longer time and electronic devices driven by small-capacity batteries.

Figure 3:
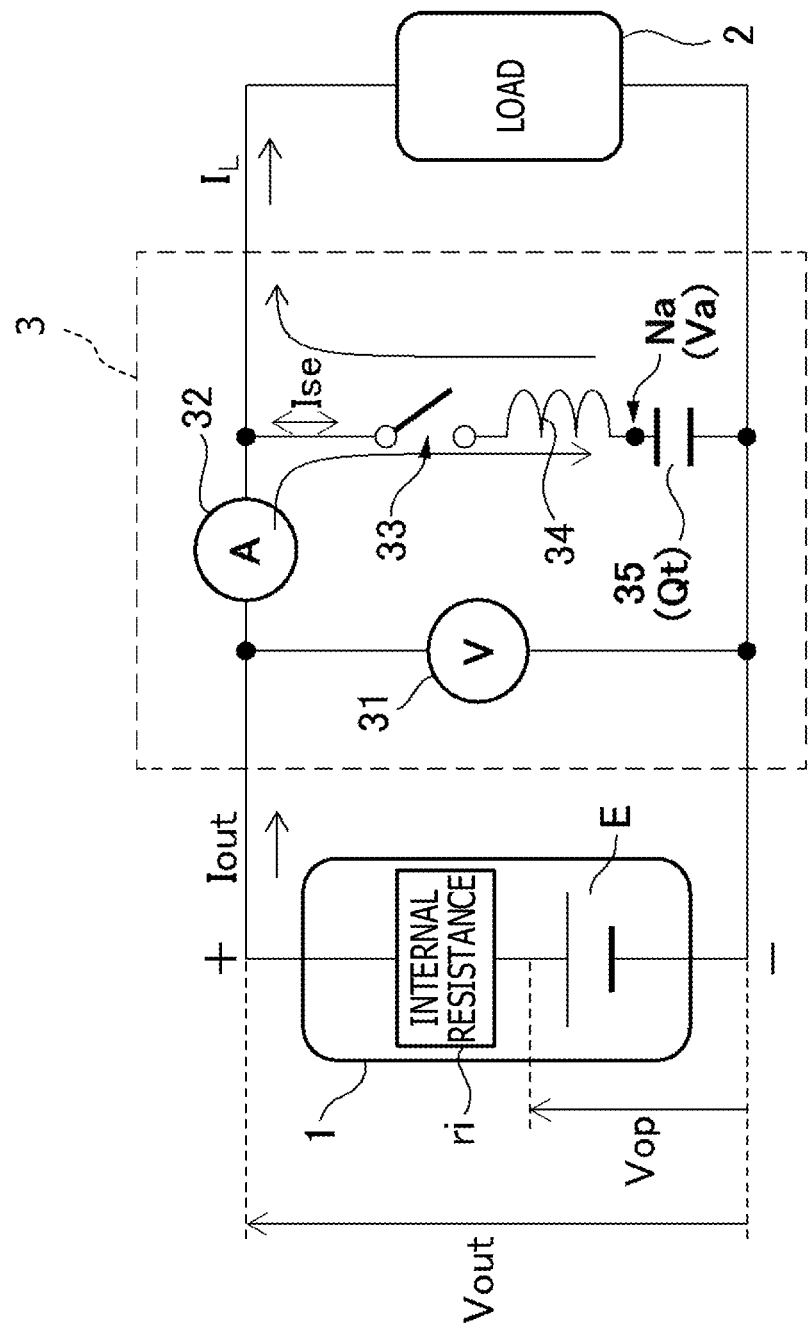
FIG. 3 illustrates an example of a remaining battery charge measuring circuit.

FIG. 3 illustrates an example of a remaining battery charge measuring circuit 3. As illustrated in FIG. 3, the remaining battery charge measuring circuit 3 includes a switch element 33, an inductance element 34, and a capacitance element 35. The inductance element 34 and the capacitance element 35 form a load (LC circuit) for measuring a current Ise. The LC circuit (34, 35) resonates upon receiving an operation response from the switch element 33, and serves as an alternating current (AC) source. The load 2 and the remaining battery charge measuring circuit 3 are connected to both terminals (positive (+) and negative (−) electrodes) of the battery 1. The remaining battery charge measuring circuit 3 is disposed between the battery 1 and the load 2.

Electric charge flowing through the LC circuit (LC resonator: 34, 35) is stored in the capacitance element 35. Upon completing measurements for one period of resonance, the electric charge used for the measurements is automatically returned to the load 2, thereby reducing a waste of power consumption.

Figure 4:
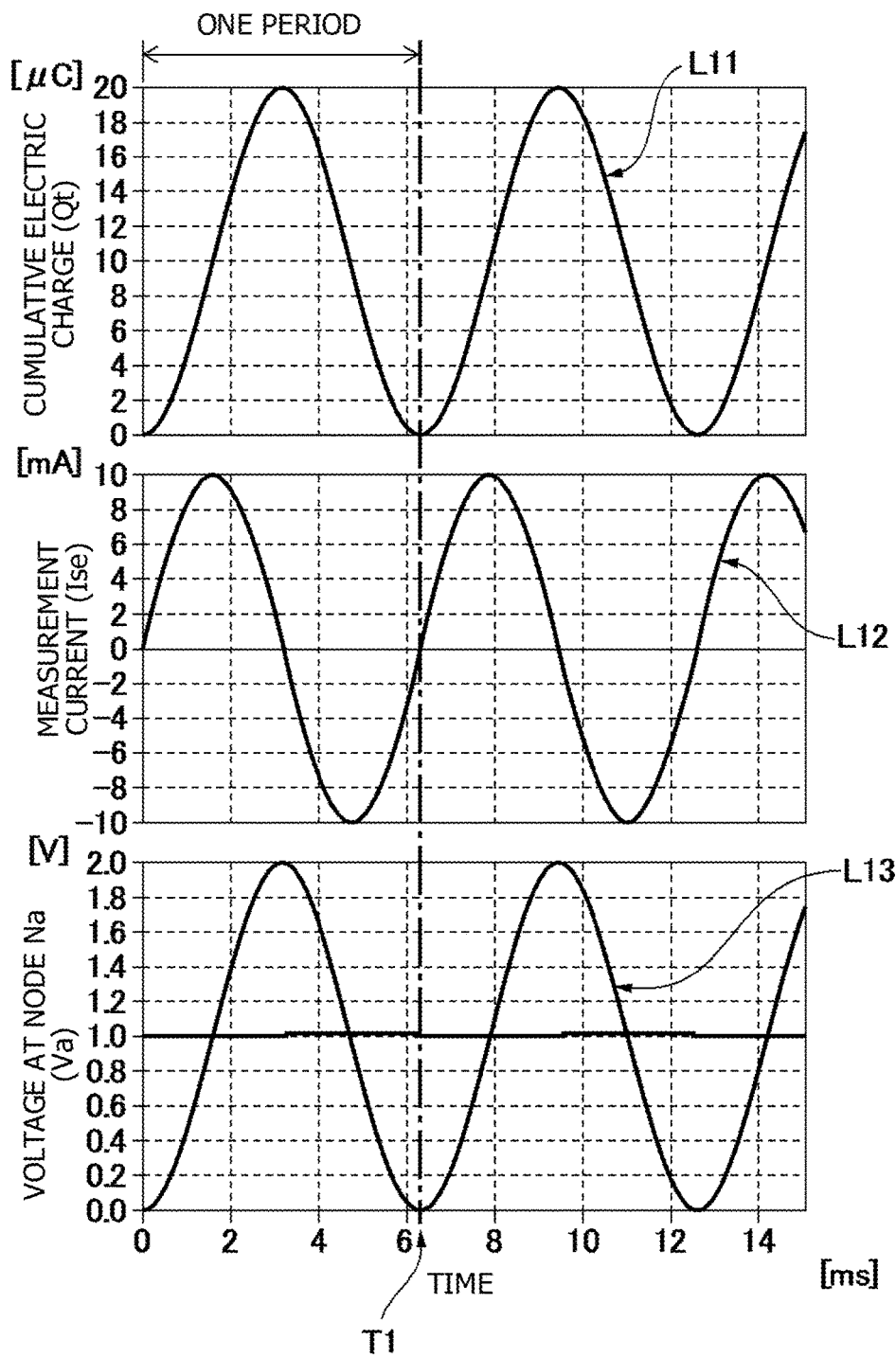
FIGS. 4A through 4C illustrate examples of operation waveforms of the remaining battery charge measuring circuit illustrated in FIG. 3.

FIGS. 4A through 4C illustrate examples of operation waveforms of the remaining battery charge measuring circuit 3 illustrated in FIG. 3. FIG. 4A illustrates a temporal change in the cumulative electric charge Qt stored in the capacitance element 35. FIG. 4B illustrates a temporal change in the measurement current Ise. The measurement current Ise corresponds to a current flowing through the inductance element 34, for example. FIG. 4C illustrates a temporal change in the voltage (capacitance element voltage) Va at a node Na connecting the capacitance element 35 and the inductance element 34.

The scale on the vertical axis of FIG. 4A represents electric charge: microcoulomb [4]. The scale on the vertical axis of FIG. 4B represents milliampere [mA]. The scale on the vertical axis of FIG. 4C represents voltage: volt [V]. The scales on the horizontal axes of FIGS. 4A, 4B, and 4C represent time: millisecond [ms].

As indicated by a characteristic curve L11 in FIG. 4A, the cumulative electric charge Qt stored in the capacitance element 35 changes as in a waveform in which a sine wave shifts to the positive side (sine-wave shift waveform), based on the resonant frequency of the LC circuit (34, 35). The cumulative electric charge Qt reaches zero (0 [μC]) at a timing T1 at the end of one period.

As indicated by the characteristic curve L11 in FIG. 4A, the cumulative electric charge Qt changes from 0 to 20 [μC], for example, as in a sine-wave shift waveform, and returns to 0 [μC] at the timing T1 at the end of one period. 0 [μC] represents a state in which electric charge is not stored in the capacitance element 35 (discharging state). The capacitance element 35 enters the discharging state, not only at the timing T1 (the end of the first period), but also at the end of each period (second, third, and ... n-th period: n is a positive integer).

As indicated by the characteristic curve L12 in FIG. 4B, the measurement current Ise changes from +10 to −10 [mA], for example, as in an alternating current. As indicated by the characteristic curve L13 in FIG. 4C, the voltage Va at the node Na changes from 0.0 to 2.0 [V], for example, as in a sine-wave shift waveform, in a manner similar to the cumulative electric charge Qt illustrated in FIG. 4A.

As discussed above, in the remaining battery charge measuring circuit 3, the switch element 33 is turned OFF at the end of the first period (n-th period: n is a positive integer) when the voltage Va at the node Na (voltage of the capacitance element 35) reaches 0. This may avoid wasteful consumption of the electric charge used for measuring the remaining battery charge, thereby achieving a reduction in power consumption.

Figure 5:
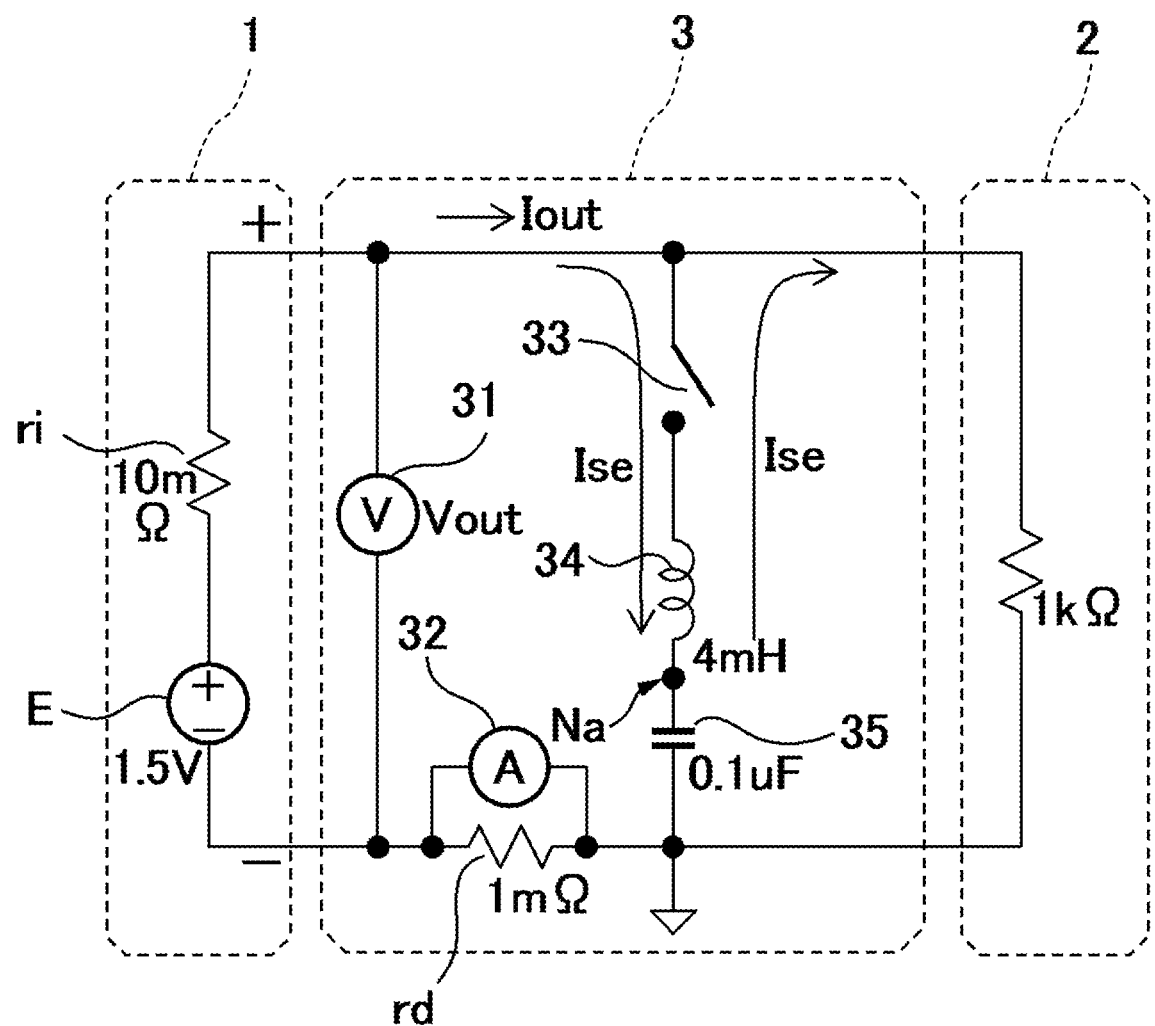
FIG. 5 illustrates an example of the remaining battery charge measuring circuit illustrated in FIG. 3.
Figure 6:
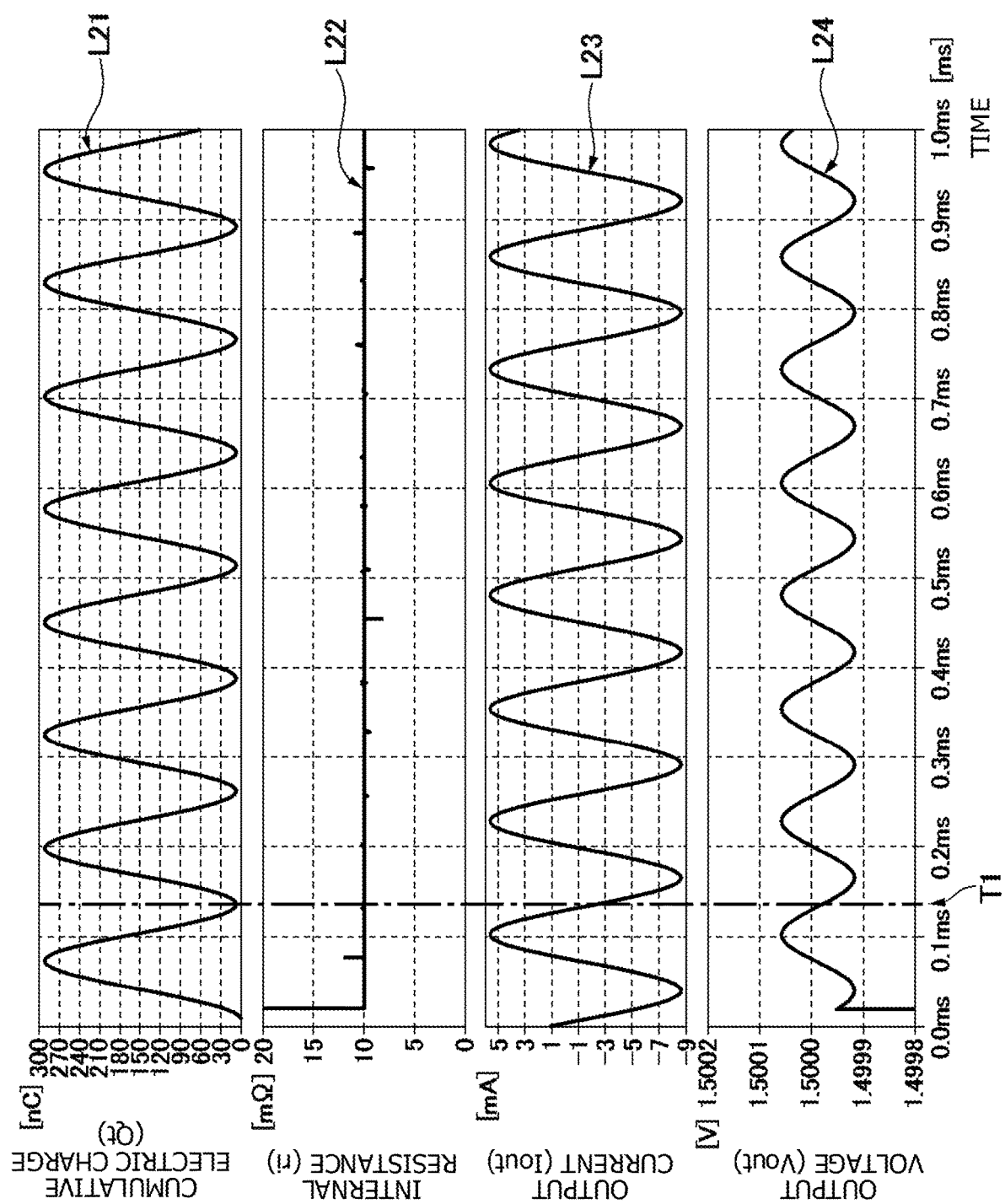
FIGS. 6A through 6D illustrate examples of operation waveforms obtained from simulation results of the remaining battery charge measuring circuit illustrated in FIG. 5.

FIG. 5 illustrates an example of the remaining battery charge measuring circuit 3 illustrated in FIG. 3. FIGS. 6A through 6D illustrate examples of operation waveforms obtained from simulation results of the remaining battery charge measuring circuit 3 illustrated in FIG. 5. FIG. 6A illustrates a temporal change in the cumulative electric charge Qt stored in the capacitance element 35. FIG. 6B illustrates a temporal change in the internal resistance ri of the battery 1. FIG. 6C illustrates a temporal change in the output current Iout of the battery 1. FIG. 6D illustrates a temporal change in the output voltage Vout of the battery 1.

The scale on the vertical axis of FIG. 6A represents electric charge: nanocoulomb [nC]. The scale on the vertical axis of FIG. 6B represents resistance (impedance): milliohm [mΩ]. The scale on the vertical axis of FIG. 6C represents current: milliampere [mA]. The scale on the vertical axis of FIG. 6D represents voltage: volt [V]. The scales on the horizontal axes of FIGS. 6A through 6D represent time: millisecond [ms].

As is seen from comparison of FIG. 5 with FIG. 3, for example, the voltage of the electromotive force E in the battery 1 is 1.5 [V], the internal resistance ri of the battery 1 is 10 [mΩ], and the resistance rd for measuring the output current Iout is 1 [mQ]. The load 2 and the remaining battery charge measuring circuit 3 are connected to both terminals (positive (+) and negative (−) electrodes) of the battery 1.

The remaining battery charge measuring circuit 3 is disposed between the battery 1 and the load 2.

The inductance of the inductance element (inductor) 34 is 4 [mH], the capacitance value (capacitance) of the capacitance element (capacitor) 35 is 0.1 [μF], and the resistance (impedance) of the load 2 is 1 [kΩ]. The measurement current Ise is an alternating current having an amplitude of 7.5 [mA], for example. Although in FIG. 5 the current measurer 32 (rd) is provided on the negative side of the battery 1, it may be provided at the positive side of the battery 1 as in FIG. 3.

In the remaining battery charge measuring circuit 3 having the circuit configuration illustrated in FIG. 5, the output current Iout changes as indicated by a characteristic curve L23 in FIG. 6C, and the output voltage Vout changes as indicated by a characteristic curve L24 in FIG. 6D. The internal resistance ri is stably calculated as a substantially fixed value such as about 10 [mΩ], as indicated by a characteristic curve L22 in FIG. 6B.

As indicated by a characteristic curve L21 in FIG. 6A, the cumulative electric charge Qt is reduced to a minimum value of about 6 [nC] at a timing T1 at the end of one period, for example. This is about 1/150 of power (7.5 [mA]×124.6 [μs]=934 [nC]) consumed when a current having an amplitude of 7.5 [mA] flows for one period of the resonant frequency (resonance period) of the LC circuit (34, 35), if a resistor load is used in the remaining battery charge measuring circuit illustrated in FIGS. 1 and 2.

As described above, in the remaining battery charge measuring circuit illustrated in FIG. 5, it is possible to avoid wasteful consumption of the electric charge used for measuring the remaining battery charge, thereby achieving a reduction in power consumption. The cumulative electric charge Qt may be reduced to a minimum value (zero), not only at the timing T1 (the end of the first period), but also at the end of each period (second, third, and . . . n-th period: n is a positive integer).

Figure 7:
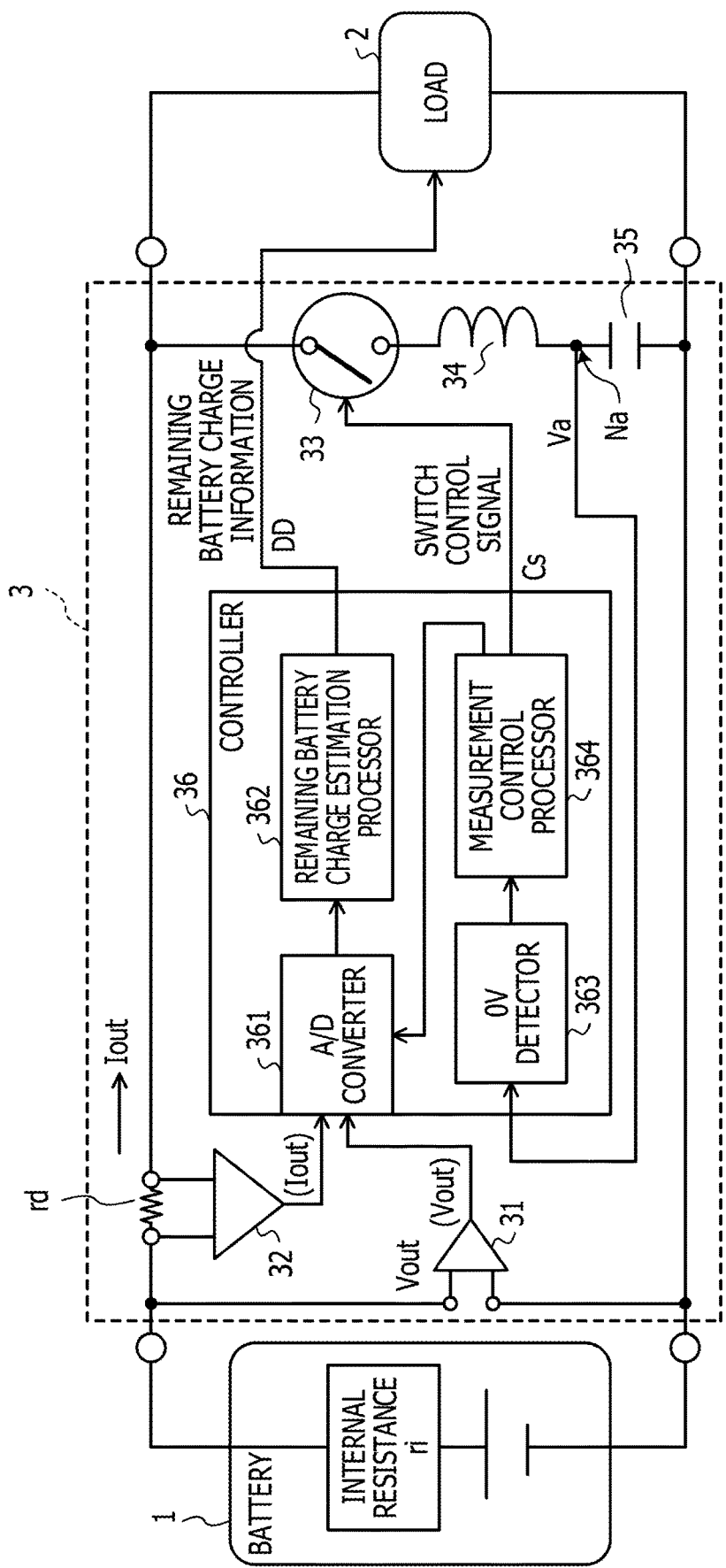
FIG. 7 illustrates an example of the remaining battery charge measuring circuit.

FIG. 7 illustrates an example of the remaining battery charge measuring circuit 3. The remaining battery charge measuring circuit 3 illustrated in FIG. 7 includes a controller 36 in addition to a voltage measurer 31, a current measurer 32, a switch element 33, an inductance element 34, and a capacitance element 35. The voltage measurer 31 is constituted by a differential amplifier, and the current measurer 32 is constituted by a differential amplifier and a measuring resistor (current measuring resistor) rd.

The controller 36 includes an analog-to-digital (A/D) converter 361, a remaining battery charge estimation processor 362, a 0V detector 363, and a measurement control processor 364. The A/D converter 361 converts an analog signal (output voltage signal (Vout)) from the voltage measurer (differential amplifier) 31 and an analog signal (output current signal (Iout)) from the current measurer (differential amplifier) 32 into digital signals, and outputs the digital signals to the remaining battery charge estimation processor 362. The 0V detector 363 detects that the voltage (capacitance element voltage) Va at the node Na reaches 0 [V] (or almost 0 [V]) and outputs this information to the measurement control processor 364.

Figure 9:
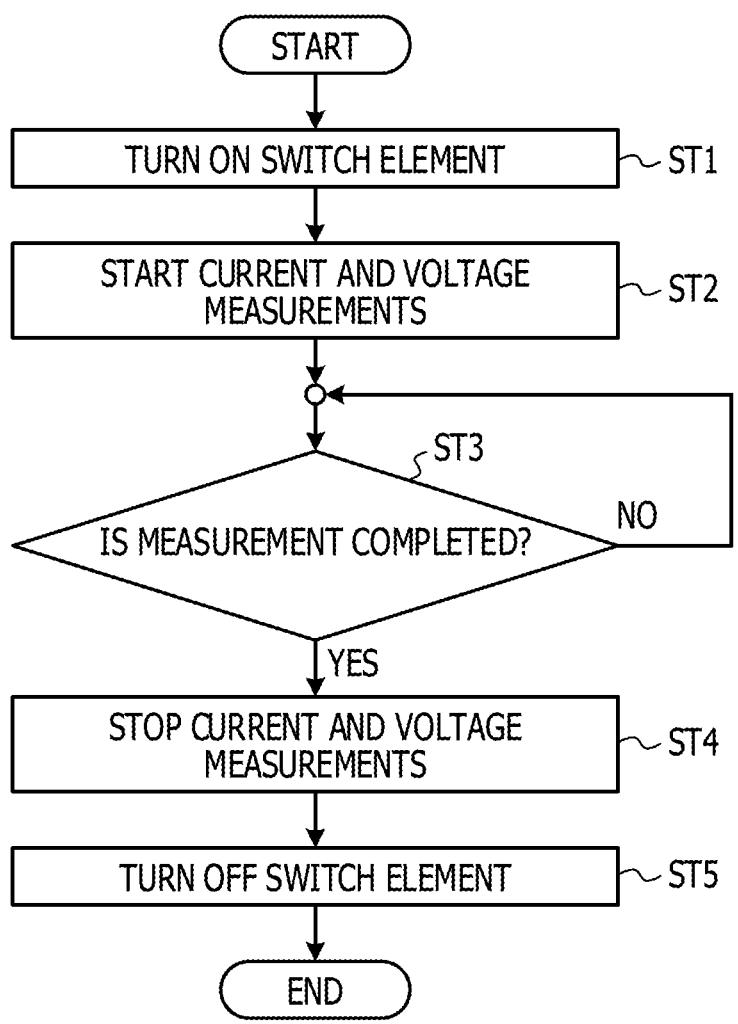
FIG. 9 illustrates an example of remaining battery charge measurement processing.

The measurement control processor 364 performs the control of the remaining battery charge measurement. More specifically, the measurement control processor 364 performs ON/OFF control of the switch element 33 by outputting a switch control signal Cs to the switch element 33, and also informs the A/D converter 361 of the state of the switch element 33. An example of remaining battery charge measurement processing (the control of the remaining battery charge measurement) executed by the measurement control processor 364 is illustrated in FIG. 9.

Figure 10:
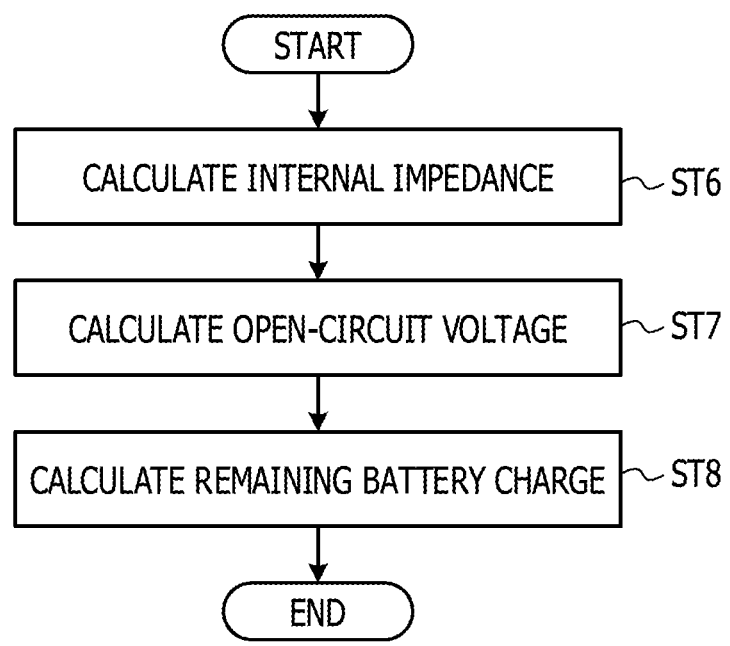
FIG. 10 illustrates an example of remaining battery charge estimation processing.

The remaining battery charge estimation processor 362 receives output from the A/D converter 361, and estimates the remaining charge of the battery 1. The remaining battery charge estimation processor 362 then outputs remaining battery charge information DD indicating the estimated remaining battery charge to the load (a microcontroller of a smartphone, for example) 2. The load 2 then switches the power mode or the system function, based on the remaining battery charge information DD received from the remaining battery charge estimation processor 362 (remaining battery charge measuring circuit 3). An example of remaining battery charge estimation processing executed by the remaining battery charge estimation processor 362 is illustrated in FIG. 10.

In the remaining battery charge measuring circuit 3 illustrated in FIG. 7, the switch element 33 is controlled so that it will be turned OFF when the voltage Va at the node Na reaches 0 [V], for example, based on the switch control signal Cs output from the measurement control processor 364.

For example, the switch element 33 is switched from ON (connect) to OFF (disconnect) at the timing (T1) at the end of one period when the cumulative electric charge Qt reaches zero (minimum). This may avoid wasteful consumption of the electric charge used for measuring the remaining battery charge, thereby achieving a reduction in power consumption. At the start of the measurements of the remaining battery charge, the switch element 33 is switched from OFF to ON, thereby causing the LC circuit (34, 35) to resonate upon receiving an operation response from the switch element 33.

Figure 8:
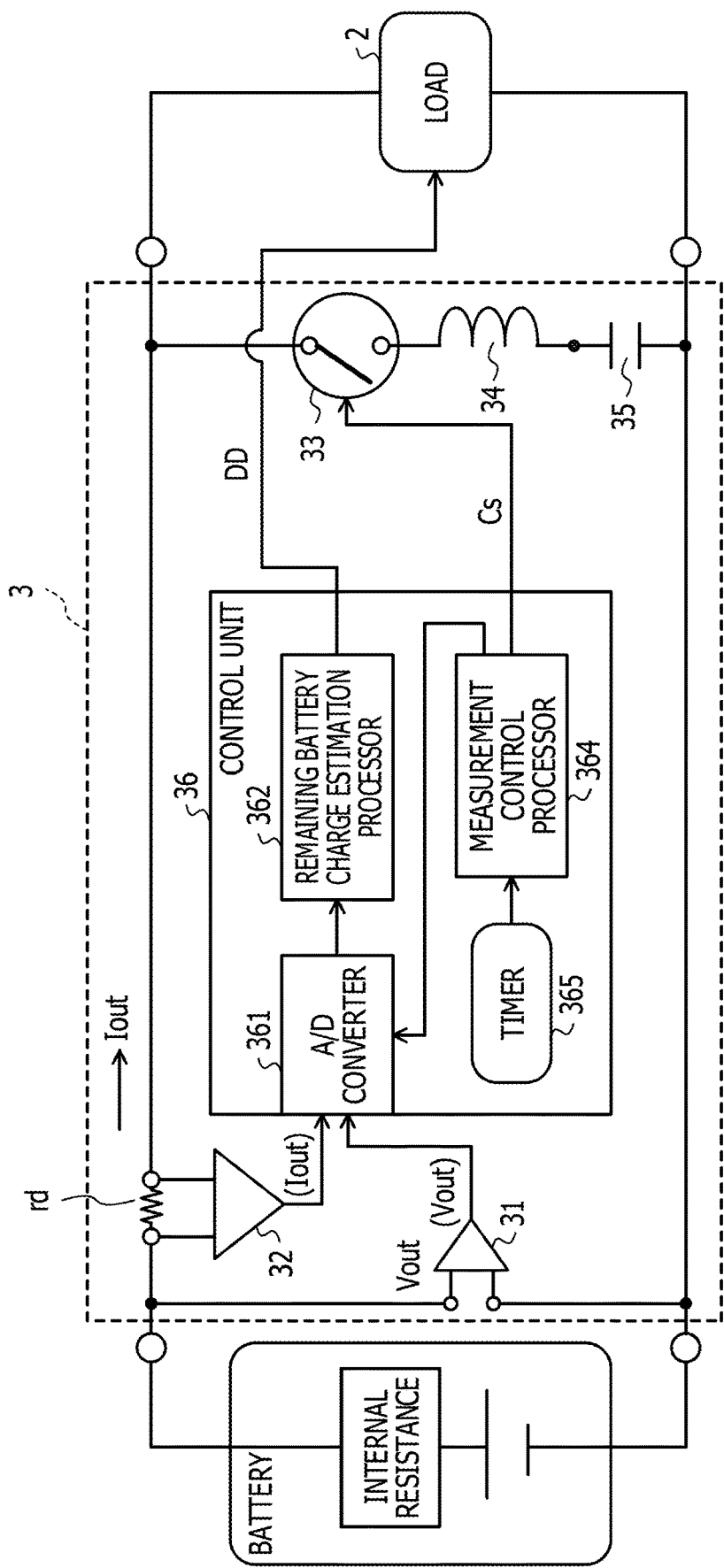
FIG. 8 illustrates an example of the remaining battery charge measuring circuit.

FIG. 8 illustrates an example of the remaining battery charge measuring circuit 3. As is seen from comparison of FIG. 8 with FIG. 7, in the remaining battery charge measuring circuit 3 illustrated in FIG. 8, a timer 365 is used instead of the 0V detector 363 illustrated in FIG. 7. In the remaining battery charge measuring circuit 3 in FIG. 8, for example, the timer 365 calculates a time based on the resonant frequency of the LC circuit (34, 35), and the calculated time is used for detecting the timing (T1) at the end of one period.

The timing at which measurements of the remaining battery charge will be completed by turning OFF the switch element 33 may be estimated by calculating the time at which the cumulative electric charge Qt will be minimized (zero) from the resonant frequency if the values of the inductance element 34 and the capacitance element 35 are known. In the remaining battery charge measuring circuit 3 in FIG. 8, the time at which the cumulative electric charge Qt will be minimized is counted by the timer 365, and the measurement control processor 364 outputs the switch control signal Cs to the switch element 33, based on output from the timer 365 (interrupt from the timer 365). The switch element 33 is then turned OFF in response to the switch control signal Cs. The configurations of the other elements of the remaining battery charge measuring circuit 3 in FIG. 8 are similar to those of the counterpart in FIG. 7, and an explanation thereof will thus be omitted.

Although in FIGS. 7 and 8 the current measurer 32 including the measuring resistor rd is provided on the positive side of the battery 1, it may be provided on the negative side of the battery 1. Various configurations of the related art are applicable to the voltage measurer 31, the current measurer 32, and the controller 36.

FIG. 9 illustrates an example of remaining battery charge measurement processing (the control of the remaining battery charge measurement). As illustrated in FIG. 9, upon starting of remaining battery charge measurement processing, in operation ST1, the switch element 33 is turned ON to apply the output voltage Vout of the battery 1 to the LC circuit (34, 35). The process then proceeds to operation ST2 in which the current and voltage measurements are started.

In operation ST2, the voltage measurer (voltmeter) 31, for example, measures the output voltage Vout of the battery 1, and the current measurer (ammeter) 32, for example, measures the output current Iout (current Ise). The process then proceeds to operation ST3. In operation ST2, the output voltage Vout and the output current Iout may be measured by using differential amplifiers, and then, the A/D converter 361 included in the controller 36 measures the output voltage Vout and the output current Iout as a voltage. If the measurement precision of the A/D converter 361 is sufficiently high and if the input impedance is also sufficiently high, the differential amplifiers may be omitted.

The measured value is obtained as the oscillation waveform of resonance generated by the LC circuit (34, 35). If the imaginary part of the internal impedance (ri) of the battery 1 is negligible, only one point other than a point having the value 0 may be measured to estimate the remaining battery charge. The measured value is converted into remaining battery charge by remaining battery charge estimation processing (calculation processing), which will be discussed with reference to FIG. 10. This calculation processing may be executed together with the measurement processing. Alternatively, measurement value data may temporarily be stored in a memory of the controller 36, for example, and may then be calculated afterwards.

In operation ST3, a determination is made as to whether measurements may be completed. If it is determined that measurements may be completed, the process proceeds to operation ST4 in which the current and voltage measurements are completed. The process then proceeds to operation ST5 in which the switch element 33 is turned OFF. The result of determination of operation ST3 becomes YES when the monitored voltage (capacitance element voltage Va) of the capacitance element 35 of the LC circuit (LC resonator) is reduced to a minimum value (VaA), as discussed with reference to FIG. 7. Alternatively, as discussed with reference to FIG. 8, if the values of the inductance element 34 and the capacitance element 35 are known, the time at which the consumed electric charge will be minimized may be calculated from the resonant frequency of the LC circuit (34, 35), and based on this calculated time (interrupt from the timer 365), it may be found that measurements may be completed.

In this manner, the switch element 33 is turned OFF at a timing at which the voltage Va of the capacitance element 35 is reduced to a minimum value (or consumed electric charge is minimized). It is thus possible to avoid wasteful consumption of electric charge used for measuring the remaining battery charge, thereby achieving a reduction in power consumption.

FIG. 10 illustrates an example of remaining battery charge estimation processing (calculation processing). As illustrated in FIG. 10, upon starting of remaining battery charge estimation processing, in operation ST6, the internal impedance (internal resistance) ri is calculated by using the voltage value and the current value of the battery 1 measured in the remaining battery charge measurement processing in FIG. 9.

If the oscillation waveform of resonance generated by the LC circuit (34, 35) is obtained in the remaining battery charge measurement processing, calculation, such as fast Fourier transform (FFT), may be performed in the controller 36. By performing calculation processing such as FFT on the oscillation waveform data, the internal impedance ri may be calculated by focusing only on the resonant frequency components of the inductance element 34 and the capacitance element 35, thereby making it possible to reduce the influence of noise. Alternatively, the internal impedance ri may be calculated by utilizing the maximum and minimum values of the oscillation waveform as the amplitude value.

In operation ST7, the open-circuit voltage (Vop) is calculated. Then, in operation ST8, the remaining battery charge is calculated. The remaining battery charge estimation processing is then completed. The remaining battery charge may be estimated by using a known technology, such as the impedance track technology.

Concerning the remaining battery charge measurement processing in FIG. 9, the remaining battery charge estimation processing in FIG. 10, and processing for supplying the remaining battery charge information to the load (an object which operates by using the battery 1) 2, the operation timing may independently be controlled by using the timer 365 included in the controller 36, for example. Regarding the order of these processing operations, upon receiving the measurement results obtained as a result of executing the remaining battery charge measurement processing, the remaining battery charge estimation processing is executed. However, the remaining battery charge information may be supplied to the load 2 at any time by storing the calculation (estimation) results obtained as a result of executing the remaining battery charge estimation processing in the memory of the controller 36.

FIG. 11 illustrates examples of operation waveforms obtained by a remaining battery charge measuring circuit as a result of executing the remaining battery charge measurement processing illustrated in FIG. 9. As illustrated in FIG. 11, the differential value of the voltage Va at the node Na in FIG. 7 corresponds to the output current of the battery 1. Accordingly, the differential value of the voltage Va may be used as the output current of the battery 1.

Figure 12A:
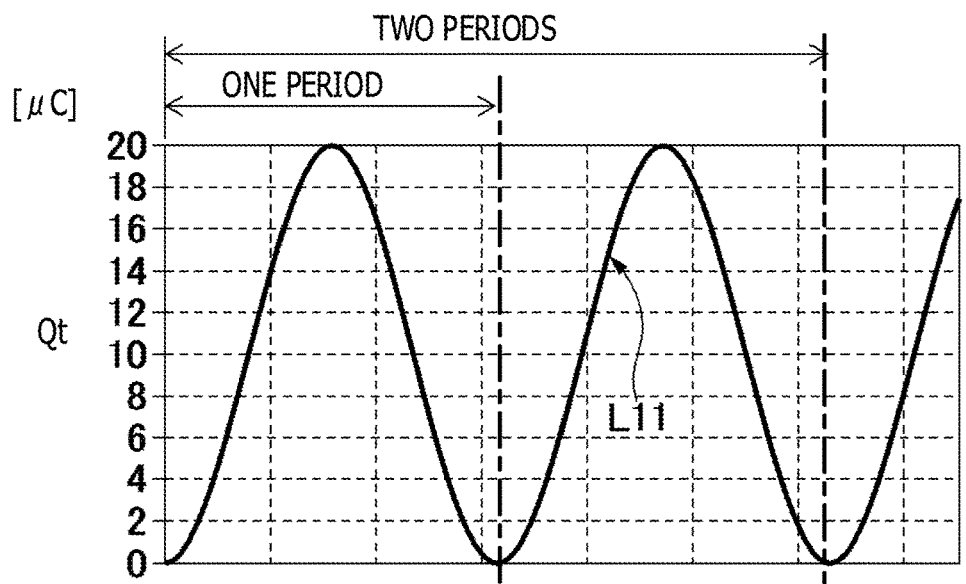
FIGS. 12A through 12C illustrate examples of the operation waveforms illustrated in FIGS. 4A through 4C.
Figure 12B:
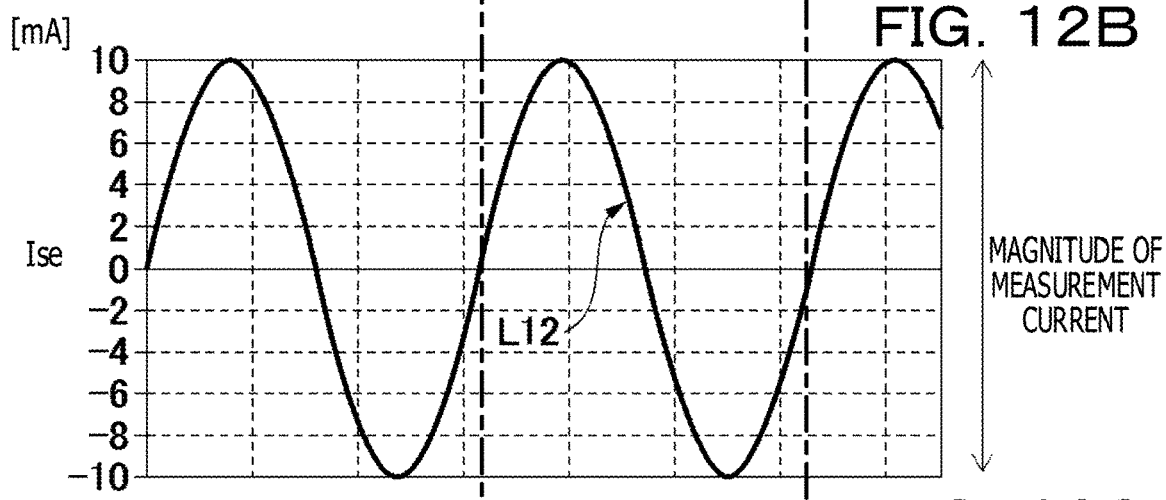
Figure 12C:
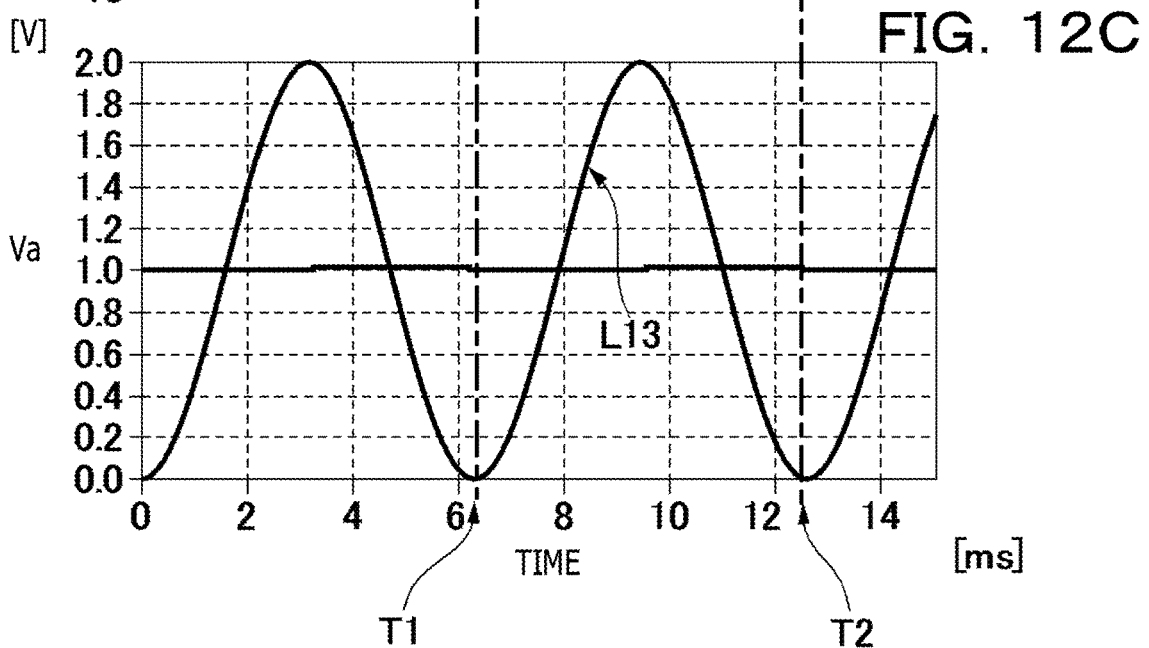

FIGS. 12A through 12C illustrate examples of the operation waveforms illustrated in FIGS. 4A through 4C. The operation waveforms in FIGS. 12A through 12C correspond to those in FIGS. 4A through 4C, respectively. As illustrated in FIGS. 12A through 12C, the timing at which the switch element 33 of each of the remaining battery charge measuring circuits 3 in FIGS. 7 and 8 is turned OFF in response to the switch control signal Cs may not necessarily be during the first resonance period of the LC circuit (34, 35), but may be during the second period. The voltage Va at the node Na is reduced to zero (minimum) at a certain timing of the n-th period (n is a positive integer), and thus, the timing at which the switch element 33 is turned OFF (measurements are completed) may be at the timing T1 of the first period, the timing T2 of the second period, . . . and the timing Tn of the n-th period.

The magnitude (amplitude) and the frequency of the measurement current Ise illustrated in FIG. 12B may be adjustable by the value of the inductance element 34 and the value of the capacitance element 35 of the LC circuit (LC resonator). The magnitude of the measurement current Ise may be adjustable also by the voltage of the capacitance element 35 (capacitor voltage Va) in the initial state. The capacitor voltage Va of the capacitance element 35 is a cumulative value of a current (electric charge). Hence, if the differential value of the voltage Va is obtained, the measurement of the current may be omitted, as stated above.

Figure 13:
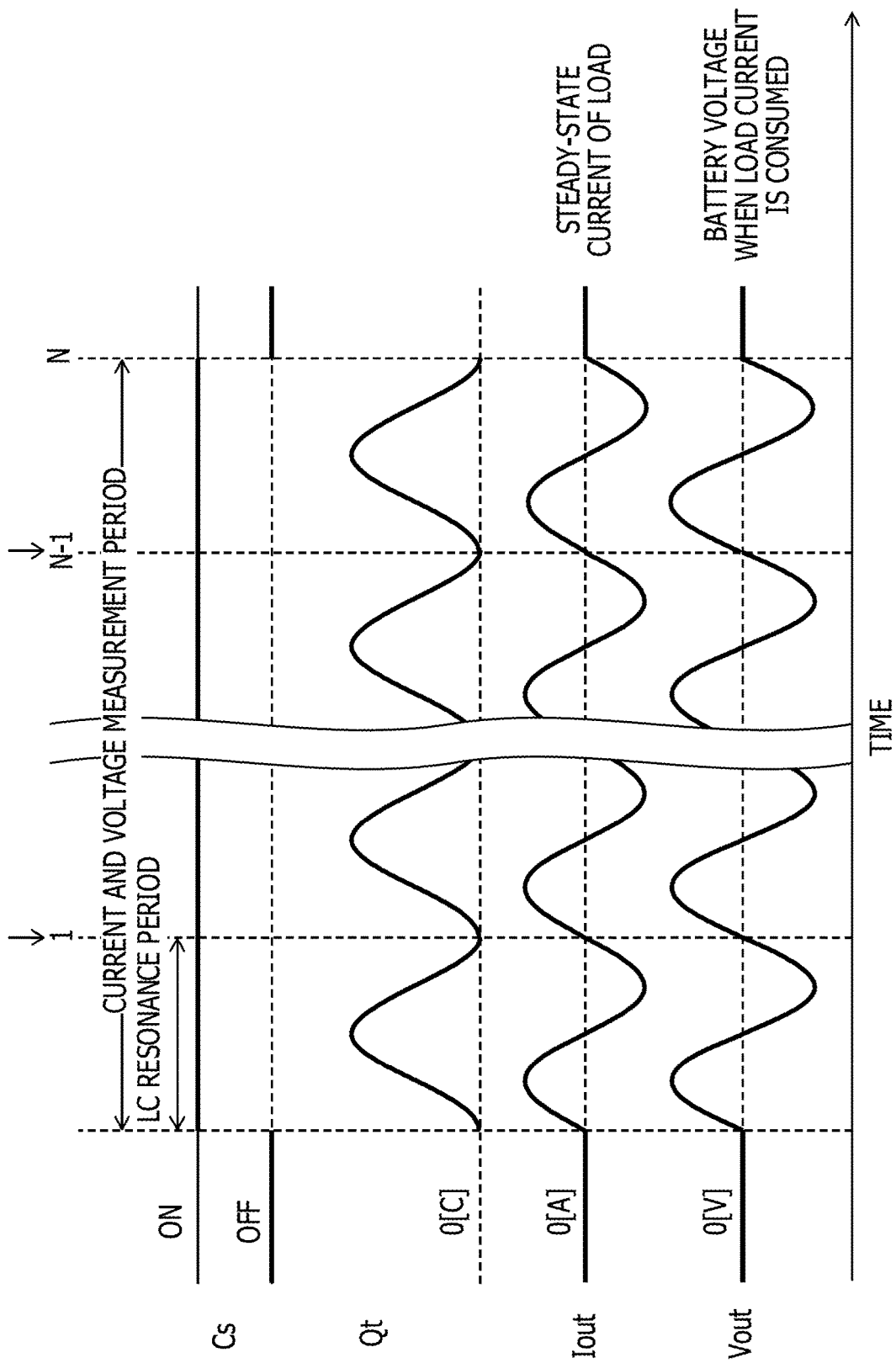
FIG. 13 illustrates examples of the operation waveforms illustrated in FIG. 11.

FIG. 13 illustrates examples of the operation waveforms illustrated in FIG. 11. In FIG. 13, measurements are conducted for a period as long as the resonance period (resonant frequency) of the LC circuit (34, 35) by N times (N is an integer of two or greater). If measurements are continuously conducted for N periods, in operation ST3 in FIG. 9, for example, the number of periods is counted. Then, if the count value X is greater than or equal to N (X≥N), it is determined that the measurements may be completed.

For example, the voltage Va at the node Na is minimized (zero) during the n-th resonance period (n is a positive integer). Thus, measurements are conducted for multiple periods (N-1 periods), and then, the switch element 33 is turned OFF at a certain timing in the N-th period at which the voltage Va is minimized. This may enhance the precision in measuring the remaining battery charge compared with a case in which measurements are conducted only for one period.

Figure 14A:
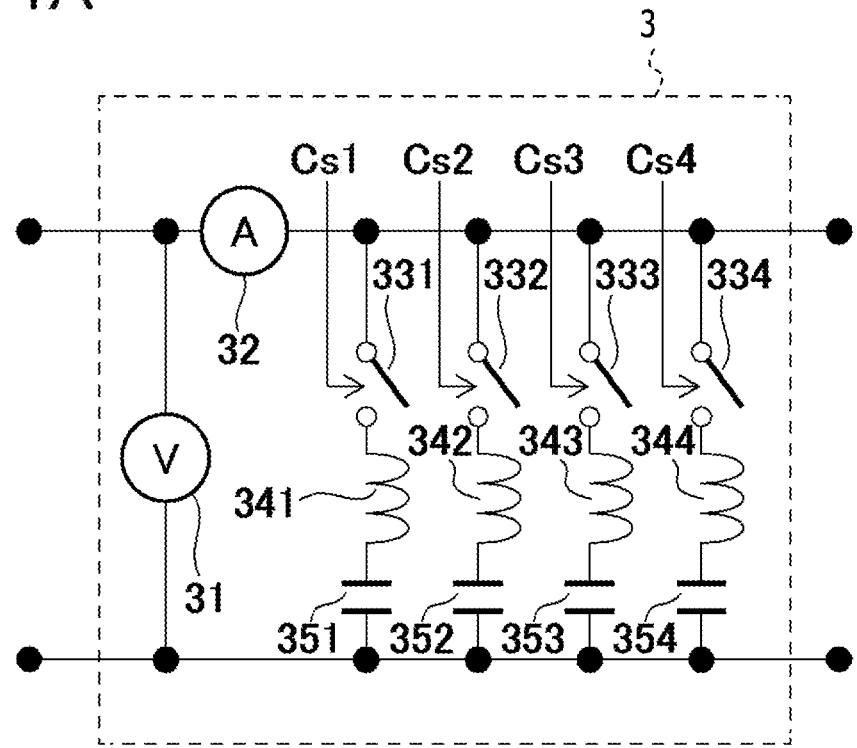
FIGS. 14A and 14B illustrate examples of the remaining battery charge measuring circuit illustrated in FIG. 3.
Figure 14B:
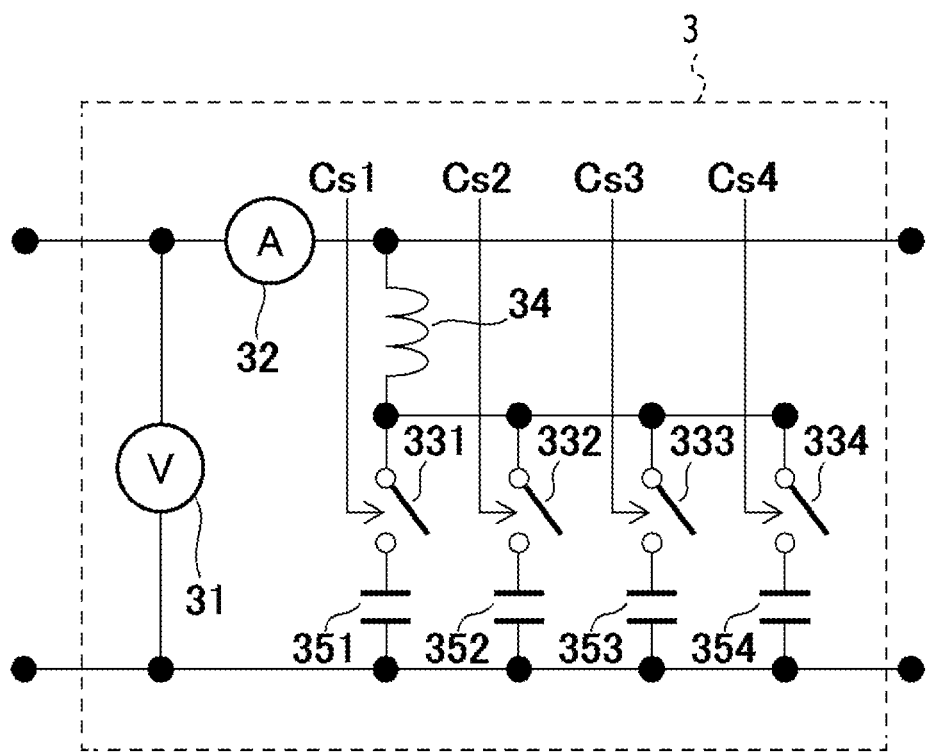

FIGS. 14A and 14B illustrate examples of the remaining battery charge measuring circuit 3 illustrated in FIG. 3. In the remaining battery charge measuring circuits 3 illustrated in FIGS. 14A and 14B, four LC circuit units, each being constituted by the switch element 33, the inductance element 34, and the capacitance element 35 illustrated in FIG. 3, are provided. FIG. 15 illustrates examples of operation waveforms of the remaining battery charge measuring circuits 3 illustrated in FIGS. 14A and 14B.

For example, as illustrated in FIG. 14A, the remaining battery charge measuring circuit 3 includes four LC circuit units constituted by switch elements 331 through 334, inductance elements 341 through 344, and capacitance elements 351 through 354. The switch elements 331 through 334 are turned ON and OFF by switch control signals Cs1 through Cs4, respectively. In the remaining battery charge measuring circuit 3 illustrated in FIG. 14B, the inductance elements 341 through 344 in FIG. 14A are replaced by a single inductance element 34. In FIG. 14B, the connecting order of the switch elements 331 through 334 and the inductance element 34 to the capacitance elements 351 through 354 is opposite that of the switch element 33 and the inductance element 34 to the capacitance element 35 in FIG. 3. Either one of the connecting orders may be used. Instead of using the common inductance element 34, as illustrated in FIG. 14B, the capacitance elements 351 through 354 may be replaced by a common capacitance element 35.

The internal impedance ri of the battery 1 has frequency-dependent characteristics due to the influence of the reaction time constant and the substance mobility, for example. In the remaining battery charge measuring circuit 3 illustrated in FIG. 3, only one LC circuit (LC resonator) constituted by the inductance element 34 and the capacitance element 35 is provided. As a result, the internal impedance ri is determined only by the fixed resonant frequency $f=1/(2\pi\sqrt{(LC)})$.

In contrast, in the remaining battery charge measuring circuits 3 in FIGS. 14A and 14B, as illustrated in FIG. 15, for example, by turning ON a different one of the switch elements 331 through 334 in each of the first through fourth periods, resonance generated by a different LC circuit unit is utilized to conduct measurements in each of the first through fourth periods. For example, in the remaining battery charge measuring circuit 3 illustrated in FIG. 14A, in the first period, by switching ON only the switch element 331 in response to the switch control signal Cs1, measurements are conducted by using the LC circuit unit constituted by the inductance element 341 and the capacitance element 351. In the second period, by switching ON only the switch element 332 in response to the switch control signal Cs2, measurements are conducted by using the LC circuit unit constituted by the inductance element 342 and the capacitance element 352.

In the third period, by switching ON only the switch element 333 in response to the switch control signal Cs3, measurements are conducted by using the LC circuit unit constituted by the inductance element 343 and the capacitance element 353. In the fourth period, by switching ON only the switch element 334 in response to the switch control signal Cs4, measurements are conducted by using the LC circuit unit constituted by the inductance element 344 and the capacitance element 354. After the fourth period, at a time T0, the switch element 334 (all the switch elements 331 through 334) is turned OFF (disconnected), and the measurements are completed.

In the remaining battery charge measuring circuit 3 illustrated in FIG. 14B, the operation of the switch elements 331 through 334 is similar to that in FIG. 14A, though the common inductance element 34 is used. Processing for conducting measurements by switching the switch elements 331 through 334 for four periods by using the four LC circuit units may repeatedly be performed multiple (N) times, as in FIG. 13. In this manner, by conducting measurements with different resonant frequencies multiple times, the precision in measuring the remaining battery charge may further be enhanced.

Figure 16:
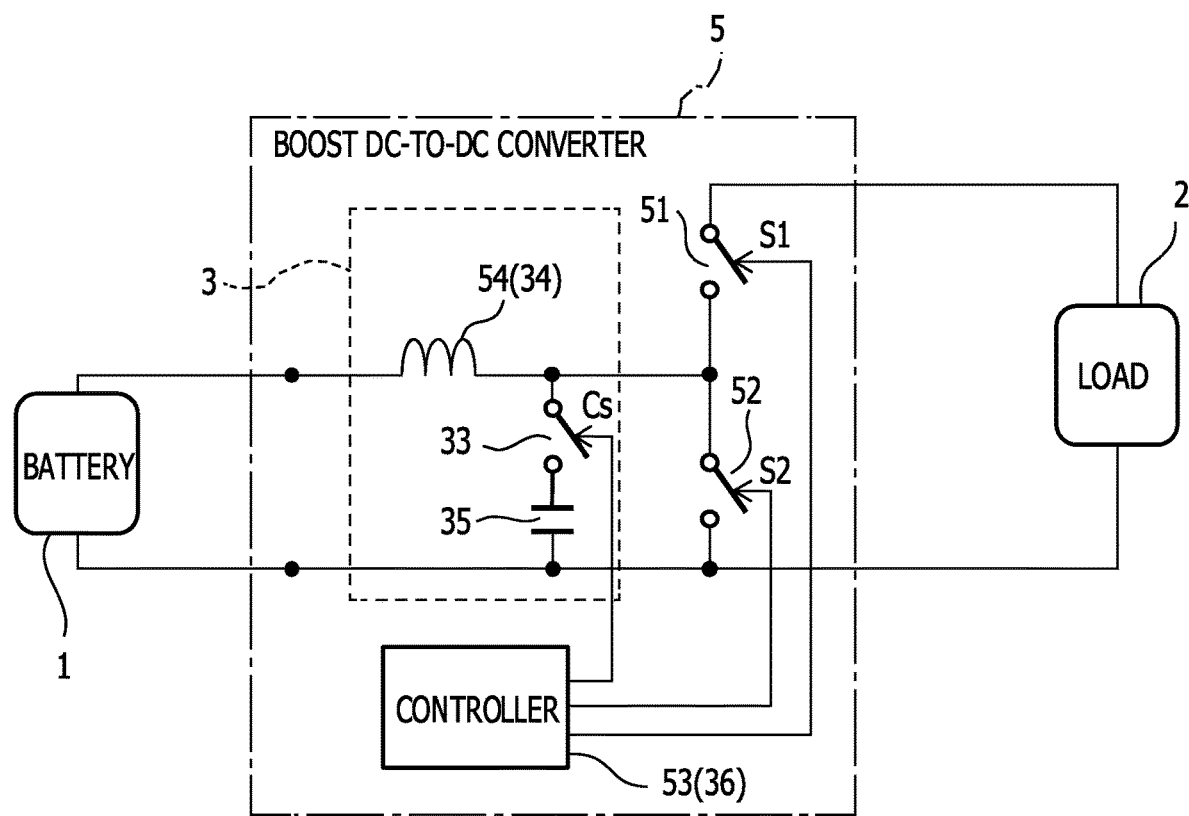
FIG. 16 illustrates an example of a boost DC-to-DC converter utilizing an example of the remaining battery charge measuring circuit.

FIG. 16 illustrates an example of a boost DC-to-DC converter 5 utilizing a remaining battery charge measuring circuit. As illustrated in FIG. 16, if an example of the remaining battery charge measuring circuit 3 according to this embodiment is applied to the boost DC-to-DC converter 5, a booster inductor in the boost DC-to-DC converter 5 may also be used as the inductance element 34, and only the switch element 33 and the capacitance element 35 may be added. In FIG. 16, other elements of the remaining battery charge measuring circuit 3, such as the voltage measurer (voltmeter) 31 and the current measurer (ammeter) 32, are not illustrated.

A typical boost DC-to-DC converter includes switch elements 51 and 52, an inductance element (voltage-converting inductance element) 54, and a controller 53. The remaining battery charge measuring circuit 3 may be formed by using the inductance element 54 as the inductance element 34. The controller 53 generates switch control signals S1 and S2 for controlling the switch elements 51 and 52, respectively, so as to boost the power supply voltage. The controller 53 may also be used as the controller 36. In this case, the controller 53 also generates the switch control signal Cs for controlling the switch element 33 of the remaining battery charge measuring circuit 3.

If the controller 53 of the boost DC-to-DC converter 5 includes a zero cross circuit, the timing at which the voltage Va of the capacitance element 35 is reduced to zero may be detected by using this zero cross circuit and be used as an interrupt signal. The output voltage Vout to the load 2 is monitored by the controller 53, and thus, the value of this output voltage Vout may also be utilized. Although in FIG. 16 the remaining battery charge measuring circuit 3 is applied to the boost DC-to-DC converter 5, it may be applied to a buck-boost DC-to-DC converter. In this manner, the remaining battery charge measuring circuit 3 is applicable to a boost DC-to-DC converter, for example, by adding only fewer components.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A remaining battery charge measuring circuit for measuring remaining charge of a battery, comprising:
an LC circuit including an inductance element and a capacitance element; and
a switch element that controls coupling between the battery and the LC circuit,
wherein the switch element disconnects the LC circuit from the battery, based on a resonant frequency by the LC circuit,
wherein the remaining battery charge measuring circuit further includes a controller configured to:
detect a capacitance element voltage of the capacitance element: and
turn OFF the switch element at a timing at which the detected capacitance element voltage is minimized.

2. The remaining battery charge measuring circuit according to claim 1, wherein the switch element disconnects the LC circuit from the battery at a timing of an n-th period of a resonance period by the LC circuit, n being an integer of one or greater.

3. The remaining battery charge measuring circuit according to claim 1, wherein:
the LC circuit includes a plurality of LC sub-circuits having different resonant frequencies; and
the switch element is provided for each of the plurality of LC sub-circuits and disconnects a corresponding one of the plurality of LC sub-circuits from the battery, based on the resonant frequency by the corresponding LC sub-circuit.

4. The remaining battery charge measuring circuit according to claim 3, wherein:
each of the LC sub-circuits includes the inductance element and the capacitance element; and
the inductance element or the capacitance element is shared by all the plurality of LC sub-circuits.

5. The remaining battery charge measuring circuit according to claim 1, wherein the controller is configured to:
measure an output voltage of the battery;
measure an output current of the battery;
calculate remaining charge of the battery based on the measured output voltage and the measured output current; and
generate a switch control signal which controls the switch element.

6. The remaining battery charge measuring circuit according to claim 1, wherein the controller is configured to:
count a time based on the resonant frequency by the LC circuit; and
turn OFF the switch element based on the time.

7. A remaining battery charge measuring method for measuring remaining charge of a battery, comprising:
measuring remaining charge of the battery by an LC circuit including an inductance element and a capacitance element;
disconnecting, by a switch element provided between the LC circuit and the battery, the LC circuit from the battery at a timing of an n-th period of resonance generated by the LC circuit, n being an integer of one or greater;
detecting, by a controller, a capacitance element voltage of the capacitance element; and
turning OFF, by the controller, the switch element at a timing at which the detected capacitance element voltage is minimized.

8. An electronic device comprising:
a battery; and
a remaining battery charge measuring circuit coupled to the battery and includes:
an LC circuit including an inductance element and a capacitance element; and
a switch element that controls coupling between the battery and the LC circuit,
wherein the switch element disconnects the LC circuit from the battery, based on a resonant frequency by the LC circuit,
wherein the remaining battery charge measuring circuit further includes a controller configured to:
detect a capacitance element voltage of the capacitance element: and
turn OFF the switch element at a timing at which the detected capacitance element voltage is minimized.

9. The electronic device according to claim 8, wherein the remaining battery charge measuring circuit is provided in a DC-to-DC converter, and a voltage-converting inductance element disposed in the DC-to-DC converter is also used as the inductance element of the remaining battery charge measuring circuit.

10. The electronic device according to claim 9, wherein the switch element disconnects the LC circuit from the battery at a timing of an n-th period of a resonance period by the LC circuit, n being an integer of one or greater.

11. The electronic device according to claim 9, wherein:
the LC circuit includes a plurality of LC sub-circuits having different resonant frequencies; and
the switch element is provided for each of the plurality of LC sub-circuits and disconnects a corresponding one of the plurality of LC sub-circuits from the battery, based on the resonant frequency by the corresponding LC sub-circuit.

12. The electronic device according to claim 9, wherein the remaining battery charge measuring circuit includes a controller configured to:
measure an output voltage of the battery;
measure an output current of the battery;
calculate remaining charge of the battery based on the measured output voltage and the measured output current; and
generate a switch control signal which controls the switch element.

* * * * *